United States Patent
Chen et al.

[19]

[11] Patent Number: 6,115,244
[45] Date of Patent: Sep. 5, 2000

[54] ENGAGING AND OUTWARD PUSHING MECHANISM FOR EXPANSION MODULE/ CELL OF PORTABLE COMPUTER

[75] Inventors: Ying-Hu Chen; Po-An Lin; Chung-Chi Chien, all of Taipei, Taiwan

[73] Assignee: Compal Electronics Inc., Taipei, Taiwan

[21] Appl. No.: 09/061,993

[22] Filed: Apr. 17, 1998

[51] Int. Cl.[7] .................................. G06F 1/16; H05K 7/02
[52] U.S. Cl. ........................ 361/684; 361/680; 361/685; 361/686; 439/159
[58] Field of Search ..................................... 361/680, 685, 361/686, 683, 684; 439/159, 358

[56] References Cited

U.S. PATENT DOCUMENTS

| | | | |
|---|---|---|---|
| 4,571,456 | 2/1986 | Paulsen et al. | 312/327 |
| 5,526,227 | 6/1996 | Satou et al. | 361/684 |

*Primary Examiner*—Leo P. Picard
*Assistant Examiner*—Hung Van Duong
*Attorney, Agent, or Firm*—Bacon & Thomas

[57] ABSTRACT

An engaging and outward pushing mechanism for expansion module/cell of portable computer is disclosed. The mechanism includes at least one pushing member pivotally disposed in the portable computer base adjacent to a chamber of the base. The chamber is for receiving the expansion module or the cell. The pushing member is composed of an engaging section and a pushing section fitted with each other. When a user desires to push the expansion module/cell into the base, the engaging section of the pushing member is pushed away from the pushing section for smoothly placing the expansion module/cell into the base. Reversely, when the user desires to take the expansion module/cell out of the base, first the engaging section of the pushing member is pushed away from the pushing section and then the engaging section is outward rotated away from the base so as to push the expansion module/cell out of the base in a quite strength-saving manner.

7 Claims, 5 Drawing Sheets

ENGAGING AND OUTWARD PUSHING MECHANISM FOR EXPANSION MODULE/CELL OF PORTABLE COMPUTER

BACKGROUND OF THE INVENTION

The present invention relates to an engaging and outward pushing mechanism for expansion module/cell of portable computer. The mechanism permits a user to place the expansion module/cell into or out of the portable computer base in a quite strength-saving manner.

In a portable computer with drawable expansion module/cell, in order to firmly lock the placed in expansion module/cell, the chamber of the portable computer base is generally disposed with locking hook means and the expansion module/cell is disposed with cooperating notch or opening. Therefore, the locking hook can be latched with the notch or opening for firmly locating the expansion module/cell in the base. After the expansion module/cell is placed into the base, the locking hook is engaged with the notch to install the expansion module/cell in the base. When the user desires to take the expansion module/cell out of the base, the locking hook must be first disengaged from the notch so as to take out the expansion module or the cell.

By means of the above arrangement, the expansion module or the cell can be firmly located in the base. However, it is quite strength-consuming to place in or take out the expansion module or the cell from the base.

Moreover, when placing in or taking out the expansion module or the cell from the base, it often takes place that the expansion module or the cell is obstacled by the locking hook.

Therefore, it is necessary to provide an engaging and outward pushing mechanism for expansion module/cell of portable computer, which permits a user to place the expansion module/cell into or out of the portable computer base in a more easy and strength-saving manner.

SUMMARY OF THE INVENTION

It is a primary object of the present invention to provide an engaging and outward pushing mechanism for expansion module/cell of portable computer. The mechanism includes at least one pushing member pivotally disposed in the portable computer base. The pushing member is composed of an engaging section and a pushing section. When placing in or taking out the expansion module/cell from the base, the engaging section of the pushing member is pushed away from the pushing section, permitting a user to place in or take out the expansion module/cell from the base in a quite easy and strength-saving manner.

It is a further object of the present invention to provide the above engaging and outward pushing mechanism in which a resilient member is disposed between the pivot section of the base and the pivot portion of the pushing member for providing a restoring force. When a user pushes the expansion module/cell entirely into the chamber of the base, by means of the restoring force, the pushing section of the pushing member can automatically lock the expansion module/cell in the base.

The present invention can be best understood through the following description and accompanying drawings, wherein:

DETAILED DESCRIPTION OF THE PREFERRED EMBODIMENT

Figure 1:
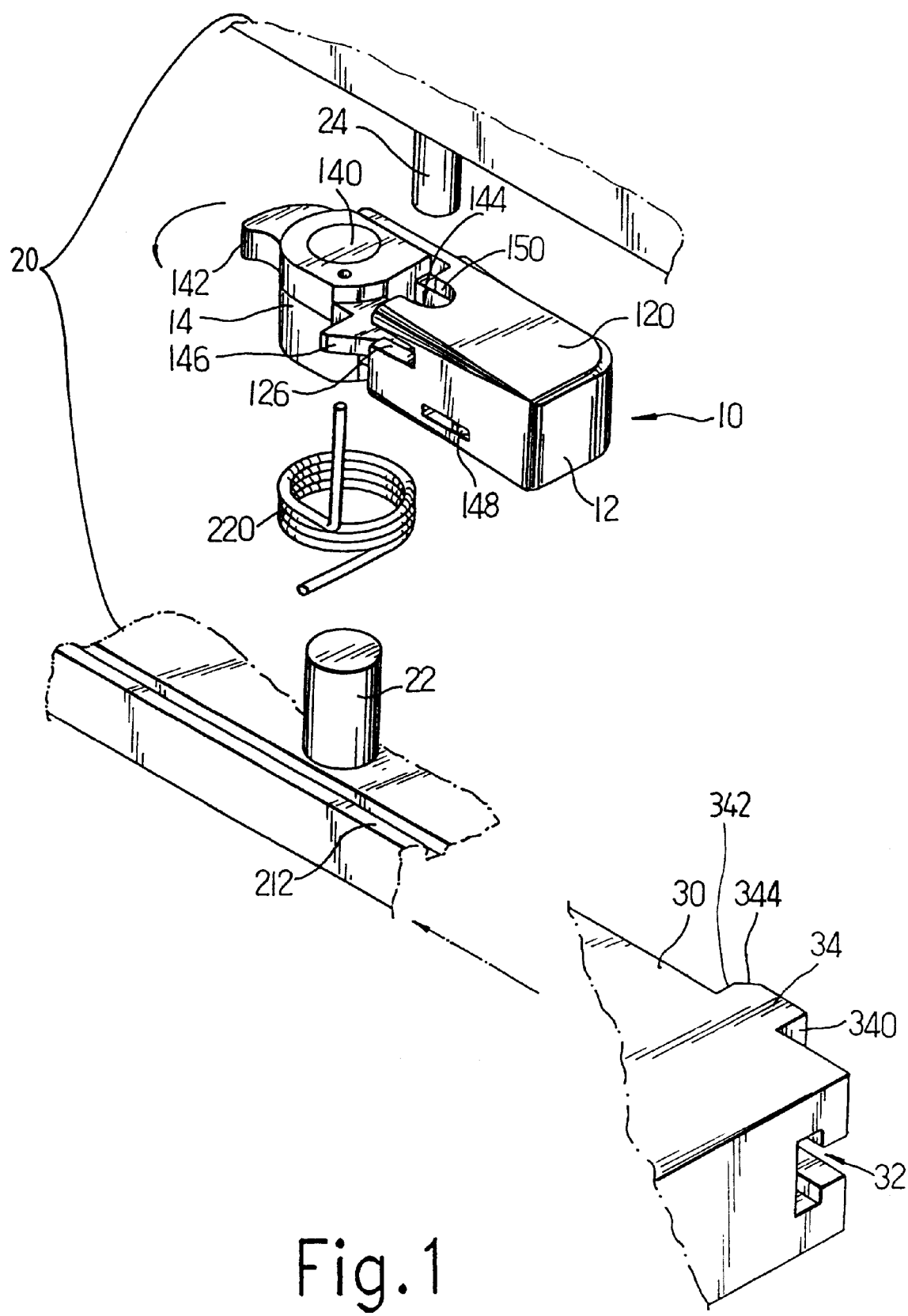
FIG. 1 is a perspective exploded view of the engaging and outward pushing mechanism and a part of the portable computer base of the present invention.

Please refer to FIG. 1. The present invention includes a pushing member 10 and a cooperating base 20 of a portable computer. By means of the present invention, a user can more easily push an expansion module 30 (or cell) into or out of the portable computer base 20.

Figure 2:
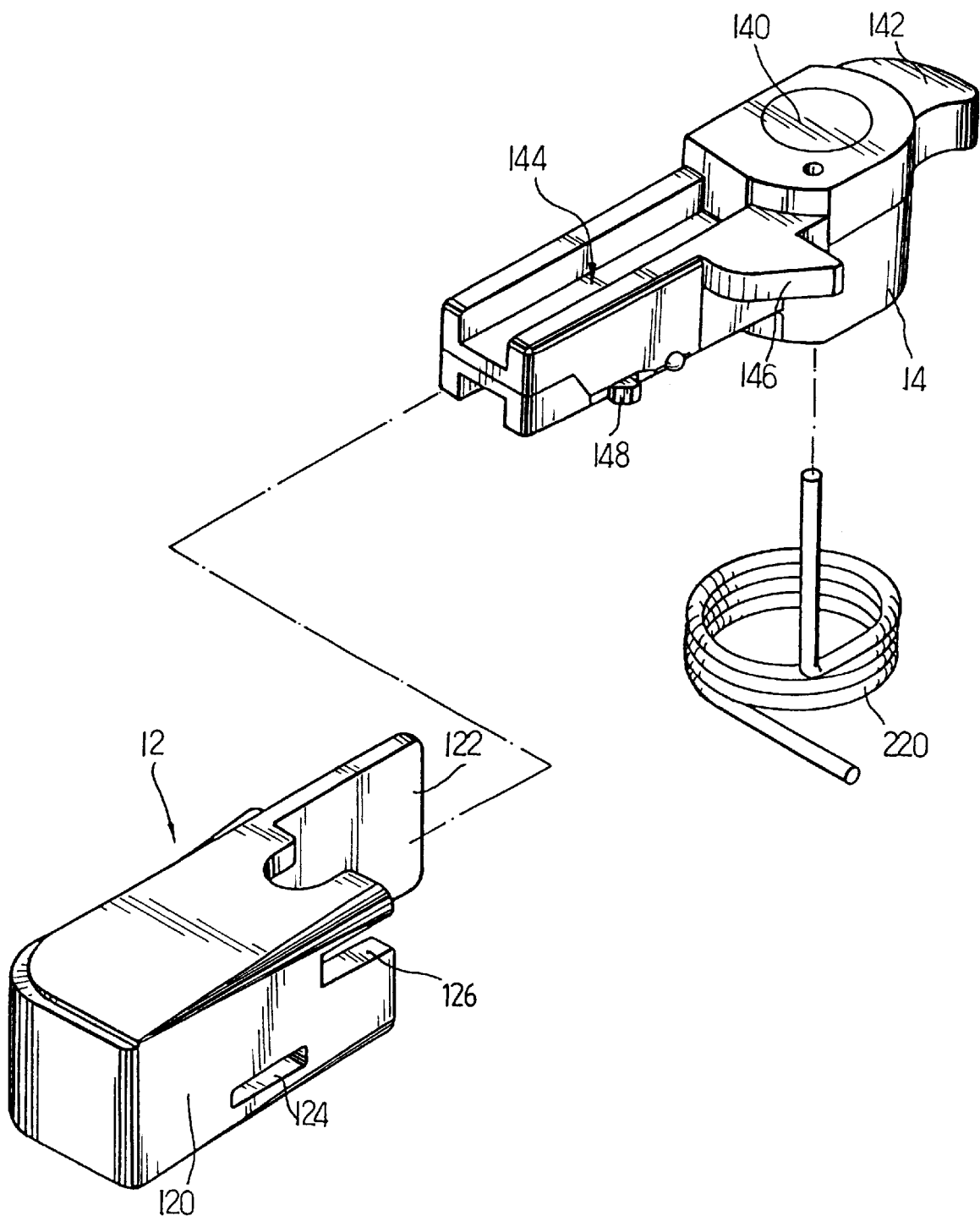
FIG. 2 is a perspective exploded view of the pushing member of the present invention.

Referring to FIG. 2, the pushing member 10 is formed by an engaging section 12 and a pushing section 14 fitted with each other. The engaging section 12 is composed of a case 120 and a protective body 122 connected therewith. The case 120 is formed with a receptacle. The case 120 is formed with a locating hole 124 and a slot 126 on one side opposite to the protective body 122.

The pushing section 14 is an elongated structure. One end of the pushing section 14 is fitted into the receptacle of the engaging section 12. The other end of the pushing section 14 is formed with a pivot portion 140 (which in this embodiment is a rotary hole or a rod body). A pushing body 142 outward extends from the other end of the pushing section 14. A channel 144 is formed on the pushing section 14 between two ends. In addition, the pushing section 14 is formed with a projection 146 on one side. Furthermore, this side of the pushing section 14 is formed with a projecting key 148 corresponding to the locating hole 124 of the engaging section 12. When the engaging section 12 is slidably fitted with the pushing section 14, the projecting key 148 is inserted into the locating hole 124, whereby the relative sliding travel of the engaging section 12 to the pushing section 14 is adjustably restricted by the locating hole 124. Therefore, the total length of the assembly of the engaging section 12 and the pushing section 14 is changeable within the restriction range of the locating hole 124.

Referring to FIG. 1, after the pushing section 14 is totally fitted into the engaging section 12, the projection 146 is slided into the slot 126 and the case 120 partially shields the channel 144. In the case that the engaging section 12 is extracted from the pushing section 14, the projecting key 148 of the pushing section 14 will abut against the front edge of the locating hole 124. At this time, the case 120 no more shields the channel 144, that is, when the pushing section 14 is pushed into the engaging section 12, the opening 150 of the channel 144 is shortened.

Further referring to FIG. 1, the portable computer base 20 is disposed with a first pivot section 22 corresponding to the pivot portion 140 of the pushing member 10. (In this embodiment, the first pivot section 22 is a fixing rod or a rotary hole.) In addition, the base 20 is disposed with a fixing rod 24 above the channel 144 of the pushing member 10. When the pushing member 10 is assembled with the base 20, the pushing member 10 is pivotally connected with the base 20 via the pivot portion 140 and the first pivot section 22. The fixing rod 24 is inserted into the channel 144 of the pushing member 10. When the engaging section 12 is pushed toward the fixing rod 24, the opening 150 will tightly clamp the fixing rod 24.

Figure 3:
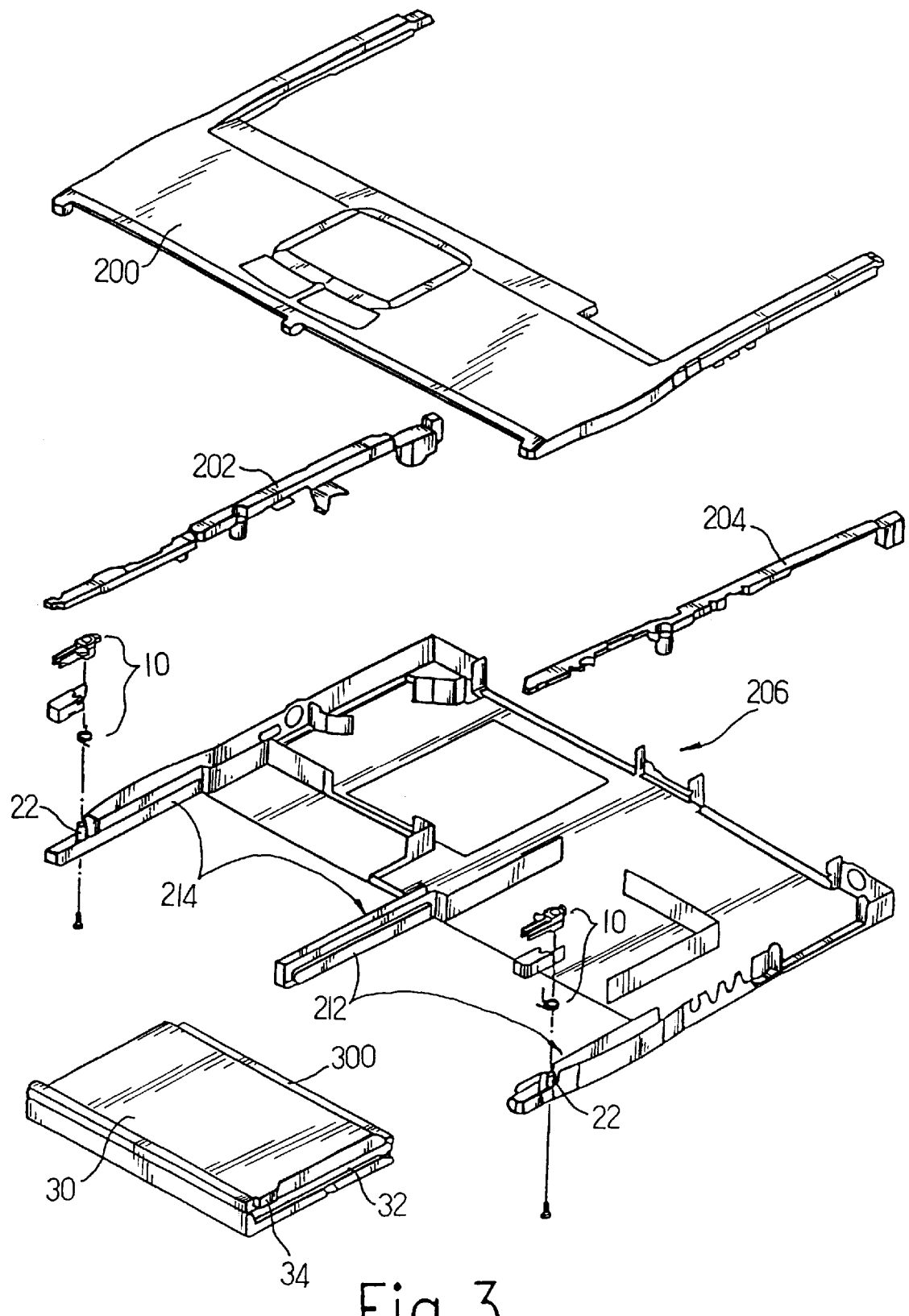
FIG. 3 is a perspective exploded view of the portable computer base and the expansion module or cell of the present invention.

Referring to FIG. 3, the base 20 is composed of a first housing 200, a first assembling member 202, a second assembling member 204, a second housing 206 and relevant electronic circuit components (not shown). One side of the base 20 is formed with a first chamber 208 (referring to FIG. 4) for receiving the expansion module 30 (or cell) and a second chamber. Two sides of the first chamber 208 and the second chamber are respectively formed with corresponding slide rails 212, 214 or slide channels.

Figure 4:
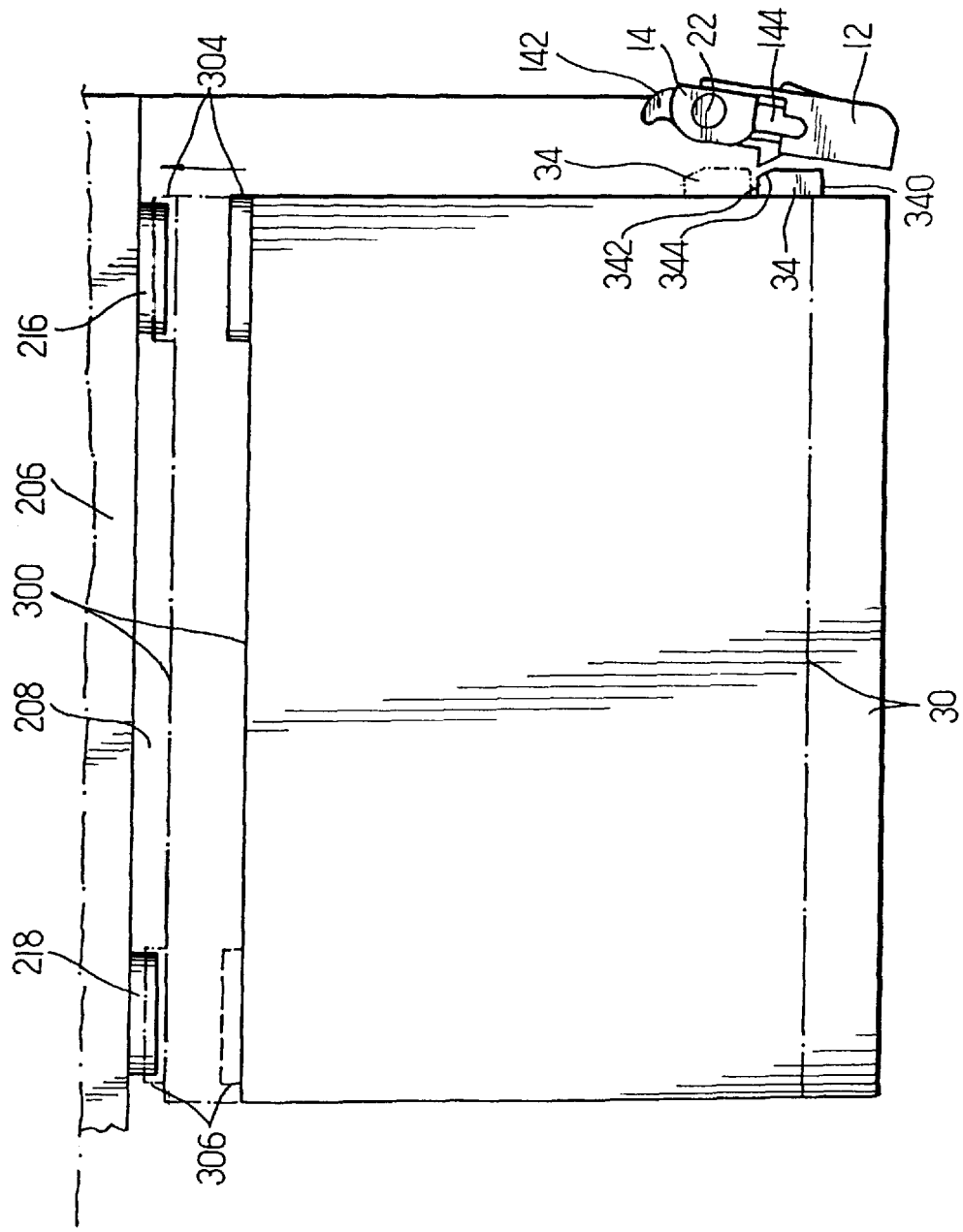
FIG. 4 shows the portable computer base in a state that the expansion module or the cell is not yet pushed into the chamber.

Referring to FIGS. 1 and 3, two sides of the expansion module 30 (or cell) are respectively formed with slide channels 32 or slide rails corresponding to the slide rails or slide channels of the first and second chambers as shown in FIG. 1. Referring to FIG. 4, the expansion module 30 has a pushing end 300 disposed with a connecting seat 304 on right side. The left side of the pushing end of the cell is disposed with a projecting power connector 306. In addition, a projecting block 34 is formed above one side of the slide channel 32 of the base 20. After the expansion module 30 (or cell) is inserted into the base 20, the end edge 342 of the projecting block 34 just corresponds to a pushing body 142 of the pushing member 10.

In order to electrically connect the first and second chambers of the base 20 with the expansion module 30 or the cell, the first chamber 208 and second chamber are disposed with expansion module connector 216 and power connector 218 corresponding to the expansion module 30 and the cell. (The expansion module connector is disposed on left side, while the power connector is disposed on right side.) After the expansion module 30 is inserted into the base 20, the connector 304 of the expansion module 30 is electrically connected with the connector 216 of the base 20, while when the cell is inserted into the base 20, the power connector 306 of the cell is electrically connected with the power connector 218.

After the expansion module 30 (or the cell) is entiredly pushed into the chamber 208, the projection 146 of the pushing section 14 will engage with the first end edge 340 of the projecting block 34 so as to prevent the expansion module 30 from undesirably detaching from the base 20. After the user further pushes the engaging section 12 into the pushing section 14, the channel 144 and the case 120 of the engaging section 12 will tightly clamp the fixing rod 24 as shown in FIG. 1. Therefore, the expansion module 30 (or the cell) is firmly locked in the base 20.

Figure 5:
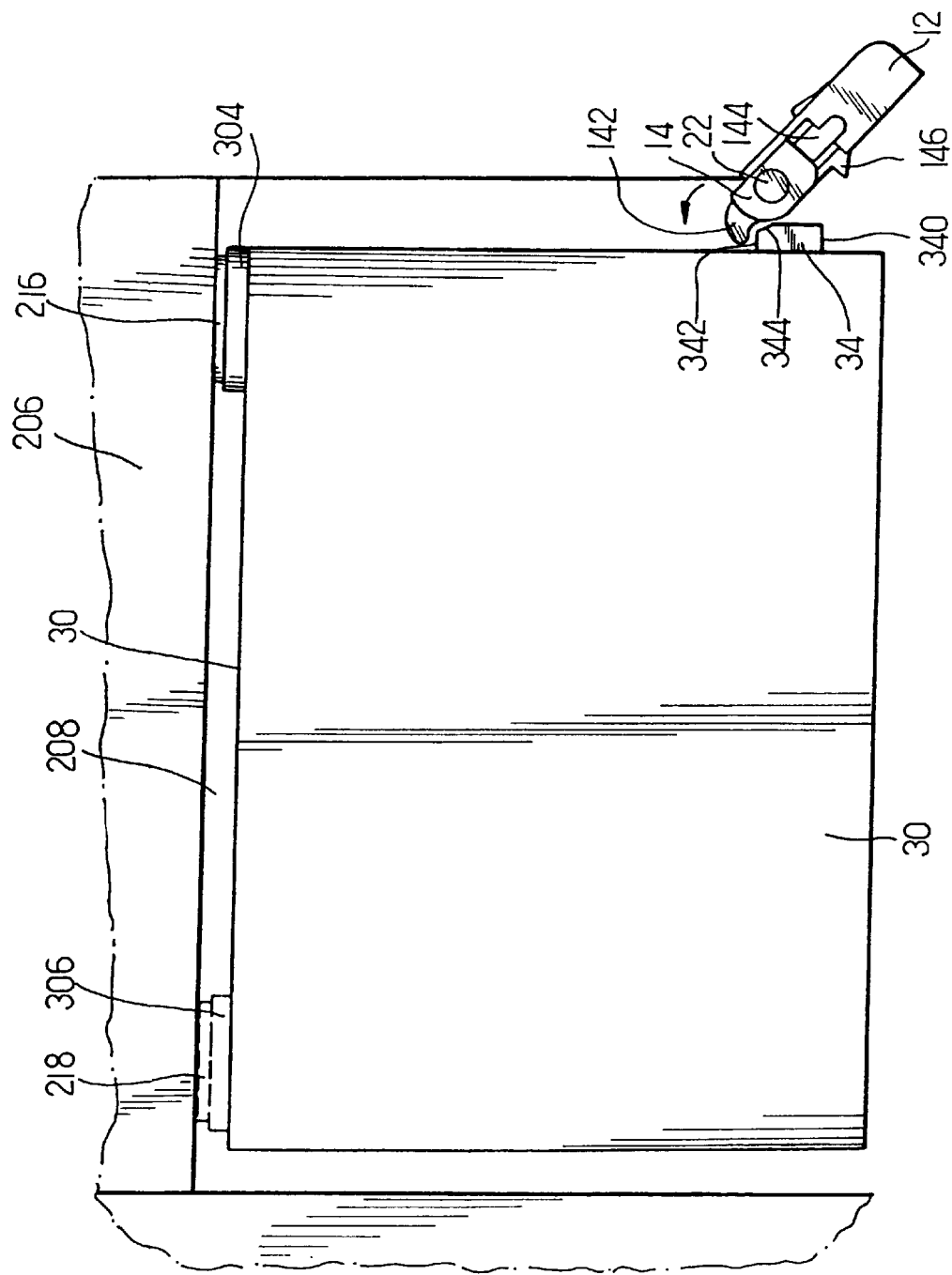
FIG. 5 shows the portable computer base in a state that the expansion module or the cell is to be pushed out of the chamber.

Referring to FIG. 5, when a user desires to take the expansion module 30 (or the cell) out of the base 20, first the engaging section 12 of the pushing member 10 is pushed away from the pushing section 14 so as to release the expansion module 30 (or the cell) from the locking force of the pushing member 10. Then the engaging section 12 is rotated out away from the chamber 208 until the pushing body 142 of the pushing section 14 abuts against the second end edge 342 of the projecting block 34. Therefore, the expansion module 30 (or the cell) can be pushed out of the base 20. Accordingly, in a quite strength-saving manner, the expansion module 30 (or the cell) can be pushed out of the base 20.

Further referring to FIG. 1, in order to push in or out the expansion module 30 (or the cell) in an even more strength-saving manner:

(1) a resilient member 220 is disposed between the first pivot section 22 of the base 20 and the periphery of the pivot portion 140 of the pushing member 10. In this embodiment, the resilient member 220 is a restoring spring. In use, when the user pushes the expansion module 30 (or the cell) into the chamber 208 to touch the projection 146 of the pushing member 10, the resilient member 220 will reserve a resilient force. When the expansion module 30 (or the cell) is entirely pushed into the base 20, by means of the restoring force, the pushing body 142 of the pushing member 10 will automatically lock the expansion module 30 (or the cell).

(2) The second end edge 342 of the projecting block 34 is formed with a slope face 344 on one side and the projection 146 of the pushing member 10 is formed with a corresponding slope face, whereby the expansion module 30 (or the cell) can be more easily pushed into the base 20.

It should be noted that the above description and accompanying drawings are only used to illustrate some embodiments of the present invention, not intended to limit the scope thereof. Any modification of the embodiments should fall within the scope of the present invention.

What is claimed is:

1. An engaging and outward pushing mechanism for expansion module/cell of portable computer, the mechanism comprising at least one pushing member and a portable computer base formed with at least one chamber for receiving the expansion module or the cell, the expansion module/cell being disposed with a projecting block on one side, wherein:

one side of the chamber is disposed with a first pivot section and at least one fixing rod;

the pushing member is composed of an engaging section and a pushing section fitted with each other, the pushing section being pivotally connected with the first pivot section;

the engaging section is formed with a receptacle for receiving one end of the pushing section;

one end of the pushing section is fitted into the engaging section, an end edge of the other end of the pushing section being formed with a projecting pushing body, one end of the pushing body being disposed with a second pivot section pivotally connected with the first pivot section, the pushing section being formed with at least one channel between two ends, one side of the pushing section being formed with a projection, whereby when the pushing section is pushed into the engaging section, the channel is shielded and shortened;

the fixing rod is inserted into the channel of the pushing member, whereby when the pushing section is forced and pushed into the engaging section, the fixing rod and the pushing member form a tightly clamping state, and when the engaging section is pushed away from the pushing section, the fixing rod and the channel no more form the tightly clamping state;

when the expansion module/cell is placed into the base, the engaging section of the pushing member is first pushed away from the engaging section and then the expansion module/cell is placed into the chamber, and thereafter, the projection on one side of the pushing member will lock one end of the projecting block of the expansion module/cell, after the engaging section is pushed into the pushing section, the expansion module/cell being locked in the base; and when a user desires to take the expansion module/cell out of the base, first the engaging section of the pushing member is pushed away from the pushing section so as to release the expansion module/cell from the locking force of the pushing member, then the engaging section being pushed away from the pushing section, whereby when rotating the engaging section, the pushing body of the pushing section will push the end edge of the projecting block, permitting the expansion module/cell to be pushed out of the base in a quite strength-saving manner.

2. An engaging and outward pushing mechanism as claimed in claim 1, wherein a resilient member is disposed between the first pivot section of the base and the pivot portion of the pushing member, whereby when a user pushes the expansion module/cell into the chamber of the base to touch the projection of the pushing member, the resilient member will reserve a resilient force, so that when the expansion module/cell is entirely pushed into the base, by means of the restoring force, the pushing body of the pushing member will automatically lock the expansion module/cell in the base.

3. An engaging and outward pushing mechanism as claimed in claim 1, wherein the engaging section is formed with a locating hole and the pushing section is formed with a projecting key corresponding to the locating hole, whereby when the engaging section is pushed away from the pushing section, the projecting key is inserted and engaged in the locating hole.

4. An engaging and outward pushing mechanism as claimed in claim 1, wherein the end edge of the projecting block is formed with a slope face on one side and the projection of the pushing member is formed with a corresponding slope face, whereby the expansion module/cell can be more easily pushed into the base.

5. An engaging and outward pushing mechanism as claimed in claim 1, wherein one side of the expansion module/cell is formed with a slide channel and one side of the chamber is formed with a slide rail, whereby the expansion module/cell can be more easily slided into the chamber.

6. An engaging and outward pushing mechanism as claimed in claim 1, wherein one side of the expansion module/cell is formed with a slide rail and one side of the chamber is formed with a slide channel, whereby the expansion module/cell can be more easily slided into the chamber.

7. An engaging and outward pushing mechanism as claimed in claim 1, wherein the first pivot section is a fixing rod and the second pivot section is a rotary hole.

* * * * *